United States Patent
Lin et al.

(10) Patent No.: US 11,121,212 B1
(45) Date of Patent: Sep. 14, 2021

(54) HIGH-VOLTAGE SEMICONDUCTOR DEVICE

(71) Applicant: Vanguard International Semiconductor Corporation, Hsinchu (TW)

(72) Inventors: Ting-You Lin, Hsinchu (TW); Cheng-Hsin Chuang, Taoyuan (TW); Shao-Chang Huang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/886,737

(22) Filed: May 28, 2020

(51) Int. Cl.
| | | |
|---|---|---|
| *H01L 29/76* | (2006.01) | |
| *H01L 29/94* | (2006.01) | |
| *H01L 29/06* | (2006.01) | |
| *H01L 29/78* | (2006.01) | |
| *H01L 29/08* | (2006.01) | |

(52) U.S. Cl.
CPC ...... *H01L 29/0646* (2013.01); *H01L 29/0653* (2013.01); *H01L 29/0878* (2013.01); *H01L 29/7816* (2013.01)

(58) Field of Classification Search
CPC ............. H01L 29/0878; H01L 29/0623; H01L 29/0653; H01L 29/0615; H01L 29/0619; H01L 29/0847; H01L 29/7815; H01L 29/7816
USPC .......................................................... 257/330
See application file for complete search history.

(56) References Cited

U.S. PATENT DOCUMENTS

| | | |
|---|---|---|
| 5,659,190 A | 8/1997 | Litwin |
| 6,013,545 A | 1/2000 | Lee |
| 2016/0071935 A1 | 3/2016 | Ito |
| 2018/0190816 A1* | 7/2018 | Siddiqui ............. H01L 29/0882 |
| 2019/0206989 A1* | 7/2019 | Siddiqui ........... H01L 29/66659 |

FOREIGN PATENT DOCUMENTS

TW          201906159 A       2/2019

* cited by examiner

*Primary Examiner* — Theresa T Doan
(74) *Attorney, Agent, or Firm* — Winston Hsu

(57) ABSTRACT

A high-voltage semiconductor device includes a substrate, a first insulating structure, a gate, a drain region, a source region and a doped region. The substrate has a first conductive type, and the first insulating structure is disposed on the substrate. The drain region and the source region are disposed in the substrate. The source region has a first portion and a second portion. The first portion has the second conductive type and the second portion has the first conductive type. The gate is disposed on the substrate, between the source region and the drain region to partially cover a side of the first insulating structure. The doped region is disposed in the substrate and has a first doped region and a second doped region, and the first doped region and the second doped region both include the first conductive type and separately disposed under the first insulating structure.

14 Claims, 4 Drawing Sheets

HIGH-VOLTAGE SEMICONDUCTOR DEVICE

BACKGROUND OF THE INVENTION

1. Field of the Invention

The present disclosure relates to a semiconductor device, and more particularly, to a high-voltage semiconductor device.

2. Description of the Prior Art

With improvement in semiconductor manufacturing, it is conceivable to fabricate control circuits, memories, low-voltage circuits, high-voltage circuits, and the related devices in a single chip for reducing costs and improving performance. And a MOS transistor device, which is widely applied for enlarging currents or signals in a circuit, serving as an oscillator of a circuit, or serving as a switch device of a circuit, is further applied to be the high power device or the high-voltage device based on the development of semiconductor processes. For example, a MOS transistor device, serving as a high-voltage device, is applied in between the internal circuits and the I/O terminals for preventing a large number of charges from suddenly spiking into the internal circuits and thus to avoid the resulted damage to the internal circuit.

It is well-known that characteristics of low on-resistance (RON) and high breakdown voltage are always required to a high-voltage semiconductor device. However, breakdown voltage and low RON are conflicting parameters with a trade-off relationship. Besides, when the device is operated under a high-voltage condition, the discontinuous current issue or abnormal increased current issue may also interfere with the entire functions of the high-voltage semiconductor device. Therefore, there is still a need to provide a high-voltage semiconductor device with improved electric functions in the related arts.

SUMMARY OF THE INVENTION

The present disclosure provides a high-voltage semiconductor device. The high-voltage semiconductor device includes a segmental isolating doped region and/or a drain doped region additionally disposed therein, so that, the impedance of the high-voltage semiconductor device may be increased to improve the uniformity of the electric field thereby. In this way, high-voltage semiconductor device of the present disclosure may therefore obtain better element reliability.

An embodiment of the present disclosure provides a high-voltage semiconductor device including a substrate, a first insulating structure, a gate, a drain region, a source region and an isolating doped region. The substrate includes a first conductive type. The first insulating structure is disposed on the substrate. The drain region is disposed in the substrate and includes a second conductive type, with the second conductive type being complementary to the first conductive type. The drain region is disposed in the substrate, and the drain region includes a first portion and a second portion, wherein the first portion includes the second conductive type and the second portion includes the first conductive type. The gate is disposed on the substrate, between the source region and the drain region to partially cover a side of the first insulating structure. The isolating doped region is disposed in the substrate, and the isolating doped region includes a first doped portion and a second doped portion, wherein the first doped portion and the second doped portion both include the first conductive type, and are separately disposed under the first insulating structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
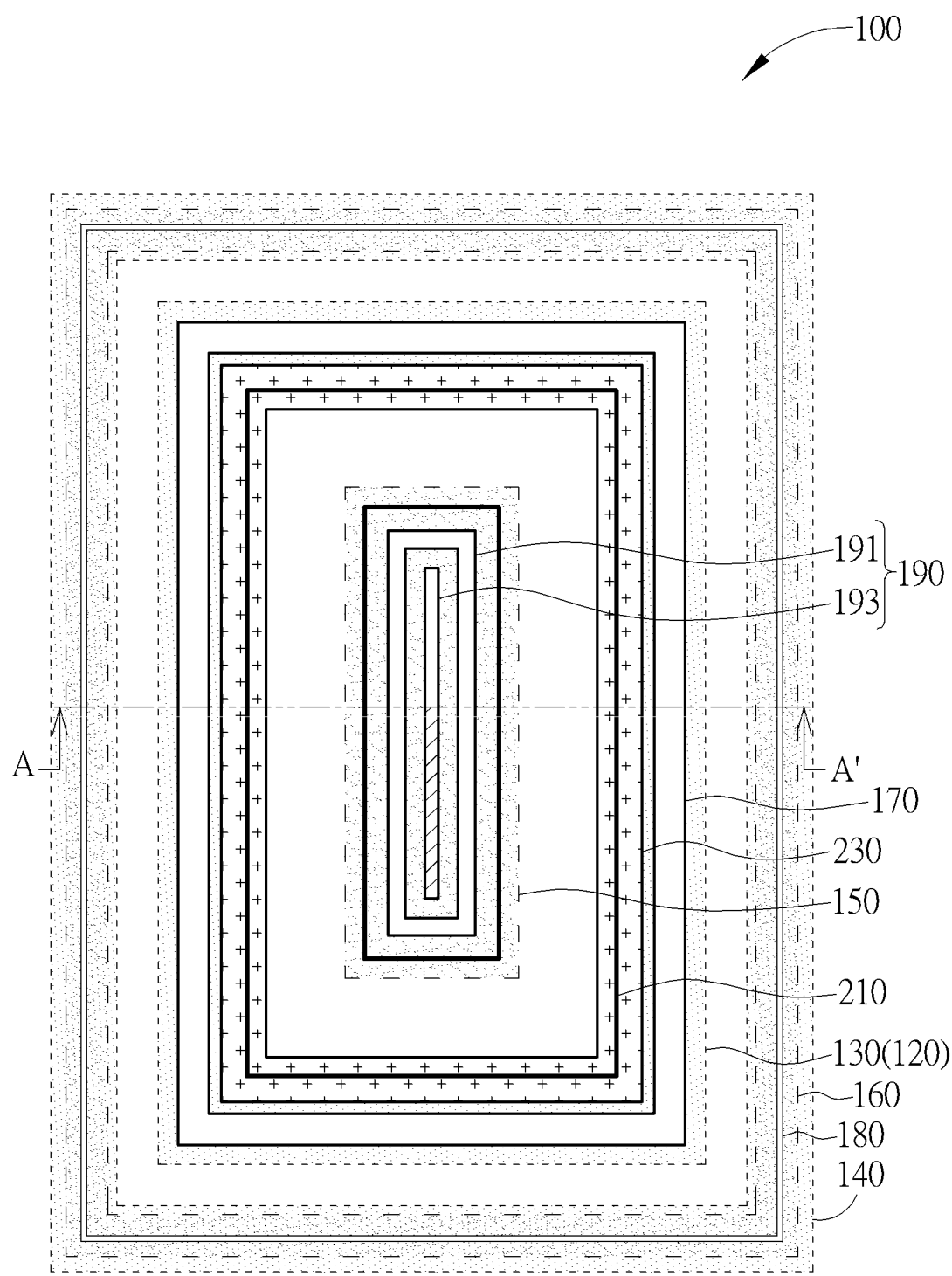
FIG. 1 shows a top view of a high-voltage semiconductor device according to a first embodiment of the present disclosure.

For better understanding of the presented disclosure, preferred embodiments will be described in detail. The preferred embodiments of the present disclosure are illustrated in the accompanying drawings with numbered elements.

In the present disclosure, the formation of a first feature over or on a second feature in the description may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Furthermore, spatially relative terms, such as "beneath," "below," "lower," "over," "above," "upper" and the like, may be used herein for ease of description to describe one element or feature's relationship to another element (s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, preferably within 10%, and more preferably within 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Figure 2:
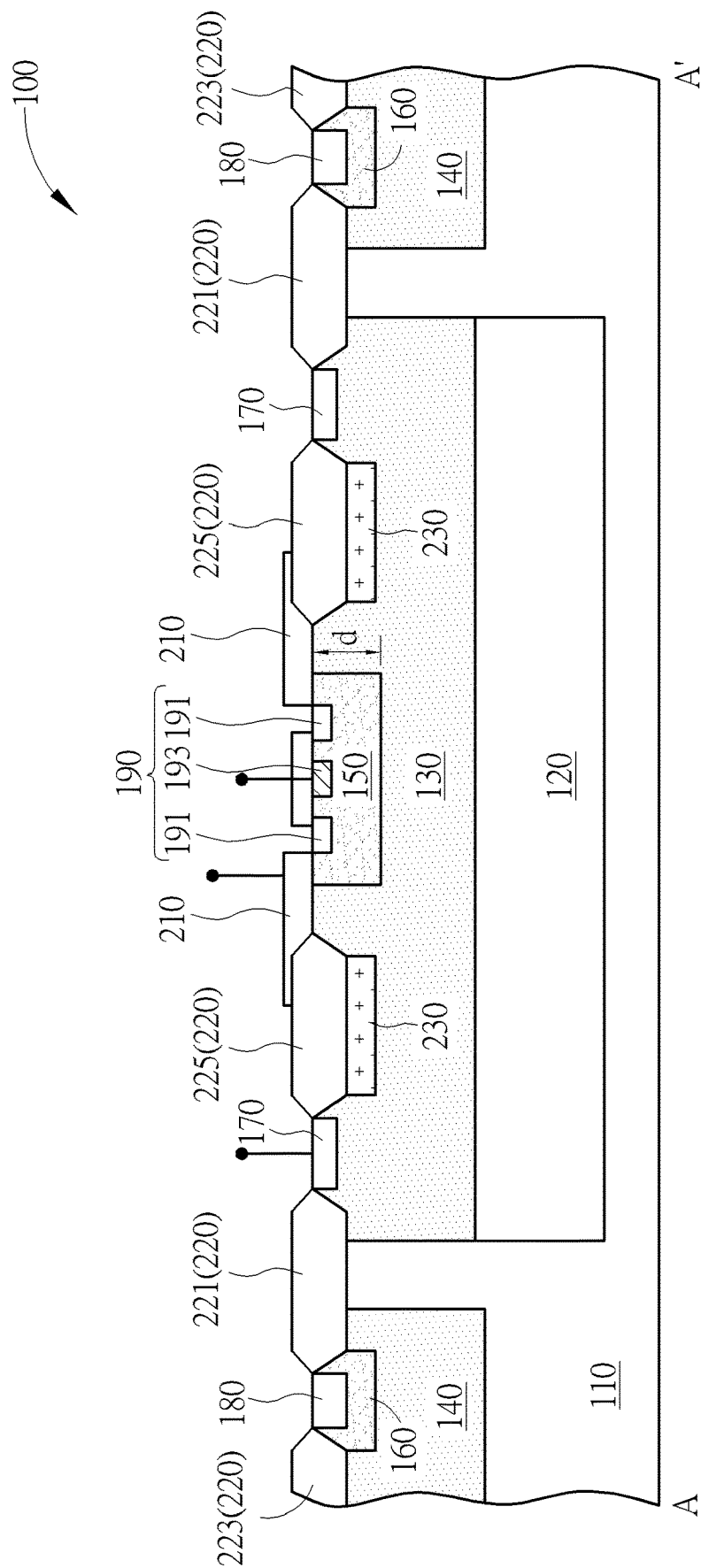
FIG. 2 shows a cross-sectional view taken along a cross line A-A' in FIG. 1.

Please refers to FIG. 1 and FIG. 2, which illustrate a high-voltage semiconductor device 100 according to the first embodiment of the present disclosure, wherein FIG. 1 shows a top view of the high-voltage semiconductor device 100, and FIG. 2 shows a cross-sectional view of the high-voltage semiconductor device 100. The high-voltage semiconductor device 100 of the present disclosure refers to a semiconductor device having an operating voltage higher than about 90 volts (V), for example it may be a lateral diffused metal oxide semiconductor transistor (LDMOS transistor) such as an N-type LDMOS or a P-type LDMOS. In the present embodiment, the high-voltage semiconductor device 100 is exemplified as an N-type LDMOS, but is not limited thereto.

Firstly, as shown in FIG. 1 and FIG. 2, the high-voltage semiconductor device 100 includes a substrate 110, such as a silicon substrate, an epitaxial silicon substrate, a silicon germanium substrate, a silicon carbide substrate or a silicon-on insulator substrate, and at least one insulating structure 220 disposed on the substrate 110. The insulating structure 220 may be a field oxide (FOX) layer which is formed for example through a local oxidation of silicon (LOCOS) process as shown in FIG. 2, but is not limited thereto. In another embodiment, the insulating structure 220 may also be a shallow trench isolation (STI) which is formed through a deposition process, or may be other insulating elements being formed by other suitable processes. It is noted that, in order to clearly show the relationships of certain specific doped regions in the high-voltage semiconductor device 100, the insulating structure 220 is omitted in FIG. 1. However, people skilled in the arts should easily realize the specific location of the insulating structure 220 through the illustration in FIG. 2. Also, the specific location and the number of the insulating structure 220 in the present disclosure will be described in subsequent paragraphs.

The substrate 110 includes a first conductive type (for example the P-type), and a first high-voltage well region 130 and a second high-voltage well region 140 are respectively disposed in the substrate 110. The first high-voltage well region 130 includes a second conductive type (for example the N-type), and the second conductive type (N-type) is complementary to the first conductive type (P-type). There is a drift region such as an N-type drift region (not shown in the drawings) formed in the first high-voltage well region 130, and a drain region 170 of the present embodiment is disposed in the drift region, with the drain region 170 also including the second conductive type (N-type). The second high-voltage well region 140 surrounds the first high-voltage well region 130, and the second high-voltage well region 140 includes the first conductive type (P-type). Furthermore, a buried layer 120 is disposed in the substrate 110, below the first high-voltage well region 130. The buried layer 120 may include the second conductive type (N-type), and a doped concentration of the buried layer 120 may be greater than a doped concentration of the first high-voltage well region 130. For example, the doped concentration of the buried layer 120 and the first high-voltage well region 130 may be about 1E17 to 1E18/cm$^3$, wherein, the doped concentration of the buried layer 120 may be about 1E18/cm$^3$, and the doped concentration of the first high-voltage well region 130 may be about 2E17/cm$^3$, but not limited thereto. People skilled in the arts should easily realize the doped concentrations of the above-mentioned doped regions may be further adjusted according to practical requirement.

The high-voltage semiconductor device 100 further includes a first deep well region 150 and a second deep well region 160, the first deep well region 150 and the second deep well region 160 are respectively disposed in the first high-voltage well region 130 and the second high-voltage well region 140, and include the first conductive type (P-type). Also, a source region 190 is formed in the first deep well region 150, a body region 180 is formed in the second deep well region 160, and a doped concentration of the body region 180 is preferably greater than a doped concentration of the second deep well region 160. In the present embodiment, the source region 190 includes a first portion 191 and a second portion 193 which are separately disposed from each other, the first portion 191 includes the second conductive type (N-type), and the second portion 193 includes the first conductive type (P-type). In one embodiment, the first portion 191 may include a ring shape, for example, in a rectangular frame shape as shown in FIG. 1, so that, the first portion 191 may surround the periphery of the second portion 193 without directly contacting the second portion 193, as shown in FIG. 1. On the other hand, the body region 180 include the first conductive type (P-type), and preferably, the body region 180 does not directly contact the drain region 170 disposed in the first high-voltage well region 130. In one embodiment, an insulating structure 221 and an insulating structure 223 are respectively disposed at two opposite sides of the body region 180, and the insulating structure 221 and an insulating structure 225 are respectively disposed at two opposite sides of the drain region 170. Accordingly, the insulating structure 221 may be sandwiched between the drain region 170 and the body region 180, so that, the drain region 170 and the body region 180 may electrically isolate from each other thereby, as shown in FIG. 2.

Also, a gate 210 is disposed on the substrate 110, and the gate 210 may be a polysilicon gate or a metal gate. The gate 210 is disposed between the source region 190 and the drain region 170, and then, the gate 210, the source region 190 and the drain region 170 may be electrically connected to corresponding voltage terminals, respectively. In one embodiment, the gate 210 may also include a ring shape, such as in a rectangular frame shape, to surround the source region 190, wherein a side of the gate 210 partially covers the first deep well region 150 disposed within the substrate 110, adjacent to the first portion 191 of the source region 190, and another side of the gate 210 partially covers on the insulating structure 225, without directly contacting the drain region 170.

The high-voltage semiconductor device 100 of the present embodiment further includes an isolating doped region 230, and the isolating doped region 230 is disposed in the substrate 110, below the insulating structure 225. The isolating doped region 230 includes the first conductive type (P-type), and which is disposed between the drain region 170 and the source region 190, to surround the source region 190, as shown in FIG. 1. The drain region 170, the source region 190 and the isolating doped region 230 are separately disposed from each other, and the drain region 170, the source region 190 and the isolating doped region 230 are electrically isolated from each other through disposing the first deep well region 150 and the first high-voltage well region 130. In one embodiment, a doped concentration of the isolating doped region 230 may be greater than the doped concentration of the first high-voltage well region 130, and a doped concentration of the first deep well region 150 may be greater than the doped concentration of the first high-voltage well region 130. For example, the doped concentrations of the isolating doped region 230 and the first high-voltage well region 130 may be about $1E17$-$1E18/cm^3$, and a doping depth "d" of the isolating doped region 230 may be about 0.1 to 2 micrometers (μm), but not limited thereto. The doped concentration of the first deep well region 150 may be $1E18$-$1E19/cm^3$, but not limited thereto. People skilled in the arts should easily realize the doped concentrations of the above-mentioned regions may be further adjusted according to practical requirement.

It is noted that, although each elements surrounded at the periphery of the second portion 193 of the source region 190, such as the first portion 191 of the source region 190, the gate 210, the isolating doped region 230, the drain region 170, the body region 180, the insulating structures 220, and the second high-voltage well area 140, are all in a rectangular shape as shown in FIG. 1, the present disclosure is not limited thereto. The aforementioned elements may also include other shapes, such as a square shape, a circular shape, a racetrack shape or other suitable shapes, so that, the whole structure of the elements may present a symmetrical structure from a top view (not shown in the drawings), with the left and right, or the top and the bottom of the elements may be symmetrical to each other.

Through these arrangements, the high-voltage semiconductor device 100 of the first embodiment in the present disclosure may have increased impedance by disposing the isolating doped region 230. When a high-voltage signal passes from the drain side (drain region 170) to the source side (source region 190) through the isolating doped region 230, the increased impedance of the high-voltage semiconductor device 100 may enhances the voltage drop ability thereof, thereby making the output signal into a low-voltage signal. Meanwhile, the disposing position of the isolating doped region 230 makes the high-voltage signal flow through a deeper path, so as to avoid the direct current flow. Thus, it is sufficient to improve the uniformity of the electric field in the present disclosure. Then, the high-voltage semiconductor device 100 of the present embodiment may obtain better device reliability.

People skilled in the arts should easily realize the high-voltage semiconductor device in the present disclosure is not limited to the aforementioned embodiment, and may further include other examples or variations. The following description will detail the different embodiments of the high-voltage semiconductor device in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
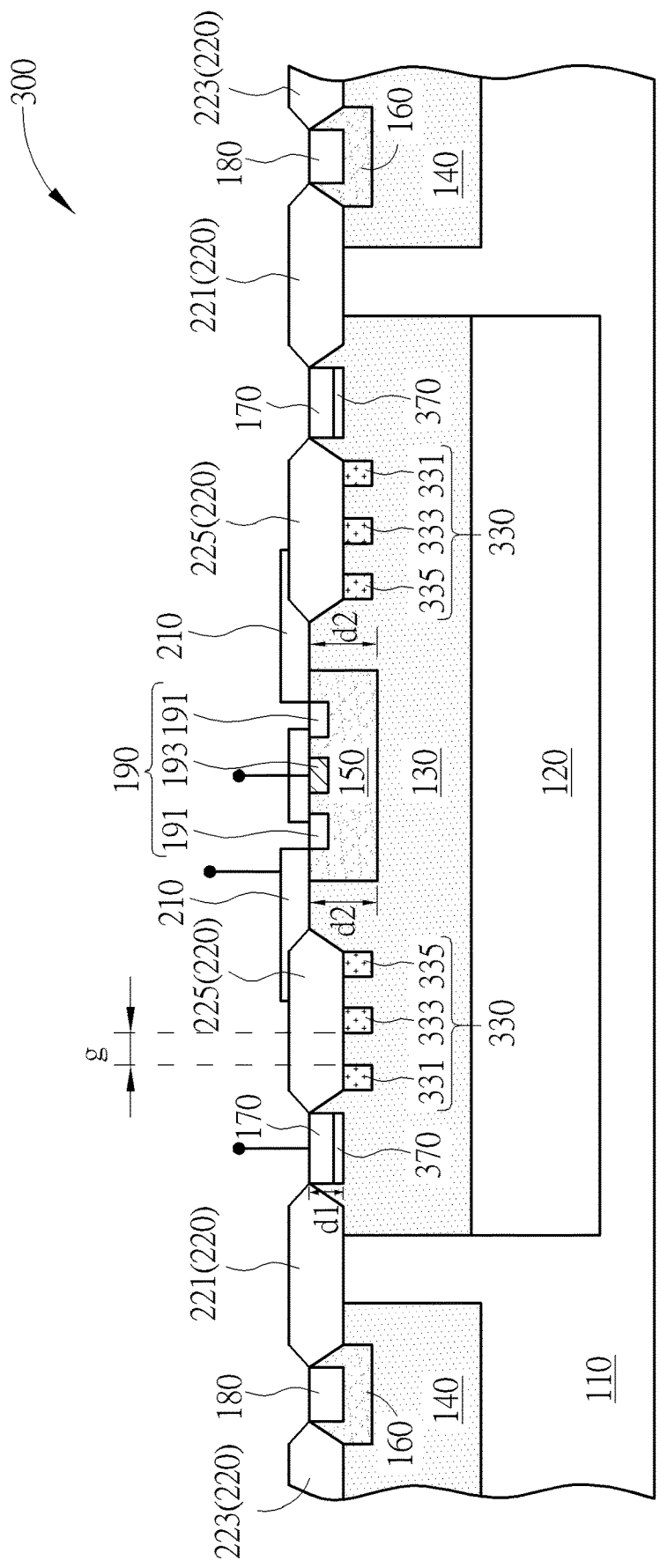
FIG. 3 is a schematic diagram illustrating a high-voltage semiconductor device according to a second embodiment of the present disclosure.

According to another embodiment of the present disclosure, a high-voltage semiconductor device is provided to further improve the Kink effect of the high-voltage semiconductor device under high-voltage operation. The Kink effect refers to an abnormal electrical performance occurred when a high-voltage semiconductor device generates discontinuous current or abnormal increased current under a high-voltage operation, resulting in exceeded loading of the high-voltage semiconductor device. The Kink effect may damage to the function and electrical performance of the high-voltage semiconductor device. Please refer to FIG. 3, which show a cross-sectional view of a high-voltage semiconductor device 300 according to the second embodiment of the present disclosure. The structure of the high-voltage semiconductor device 300 of the present embodiment is substantially similar to the high-voltage semiconductor device 100 in the aforementioned first embodiment, and which also includes the substrate 110, buried layer 120, the first high-voltage well region 130, the second high-voltage well region 140, the first deep well region 150, the second deep well region 160, the drain region 170, the body region 180, the source region 190, the gate 210, and the insulating structure 220. All similarity between the present embodiment and the aforementioned embodiment will not be redundant described hereinafter. The difference between the present embodiment and the aforementioned embodiment is mainly in that an isolating doped region 330 of the present embodiment includes a plurality of doped portions which are separately disposed from each other. For example, the isolating doped region 330 may further includes a first doped portion 331, a second doped portion 333 and a third doped portion 335, but is not limited thereto. People skilled in the arts should easily realize that the number and the disposing type of the isolating doped region 330 in the present embodiment is only for example, the practical disposing number and type thereof may be further adjusted based on specific product requirements.

Specifically, the first doped portion 331, the second doped portion 333 and the third doped portion 335 of the isolating doped region 330 are all disposed under the insulating structure 225 to directly contact the insulating structure 225. The first doped portion 331, the second doped portion 333 and the third doped portion 335 of the isolating doped region 330 include the first conductive type (P-type). In one embodiment, the first doped portion 331, the second doped portion 333 and the third doped portion 335 may include a ring shape such as a rectangular frame shape, respectively, from a top view (not shown in the drawings), so that, the first doped portion 331, the second doped portion 333 and the third doped portion 335 may sequentially surround the periphery of the source region 190, with the first doped portion 331 surrounding the second doped portion 333, the third doped portion 335 and the source region 190, and with the second doped portion 333 surrounding the third doped portion 335 and the source region 190. Furthermore, the isolating doped region 330 is disposed between the drain region 170 and the source region 190. In one embodiment the first doped portion 331, the second doped portion 333 and the third doped portion 335 may be disposed separately by equal spaces, with each of the spaces "g" being about 0.1 to 3 micrometers, but not limited thereto. In another embodiment, the first doped portion, the second doped portion and the third doped portion may also be disposed separately by different spaces (not shown in the drawings). On the other hand, the first doped portion 331, the second doped portion 333 and the third doped portion 335 may include the same doped concentration, such as being about $1E17$-$1E18/cm^3$, and include the same doped depth "d2" in the substrate 100, such as being about 1-10 micrometers. Accordingly, the first doped portion 331, the second doped portion 333 and the third doped portion 335 may be formed by using the same mask through the same implanting process, but is not limited thereto. However, in another embodiment, the first doped portion, the second doped portion and the third doped portion may also be respectively formed through different masks and different implanting processes, so that, the first doped portion, the second doped portion and the third doped portion may include different doped concentrations and doped depths (not shown in the drawings). For example, the first doped portion, the second doped portion and the third doped portion may include sequentially increased or sequentially decreased doped concentrations and/or doped depths, but not limited thereto.

Figure 4:
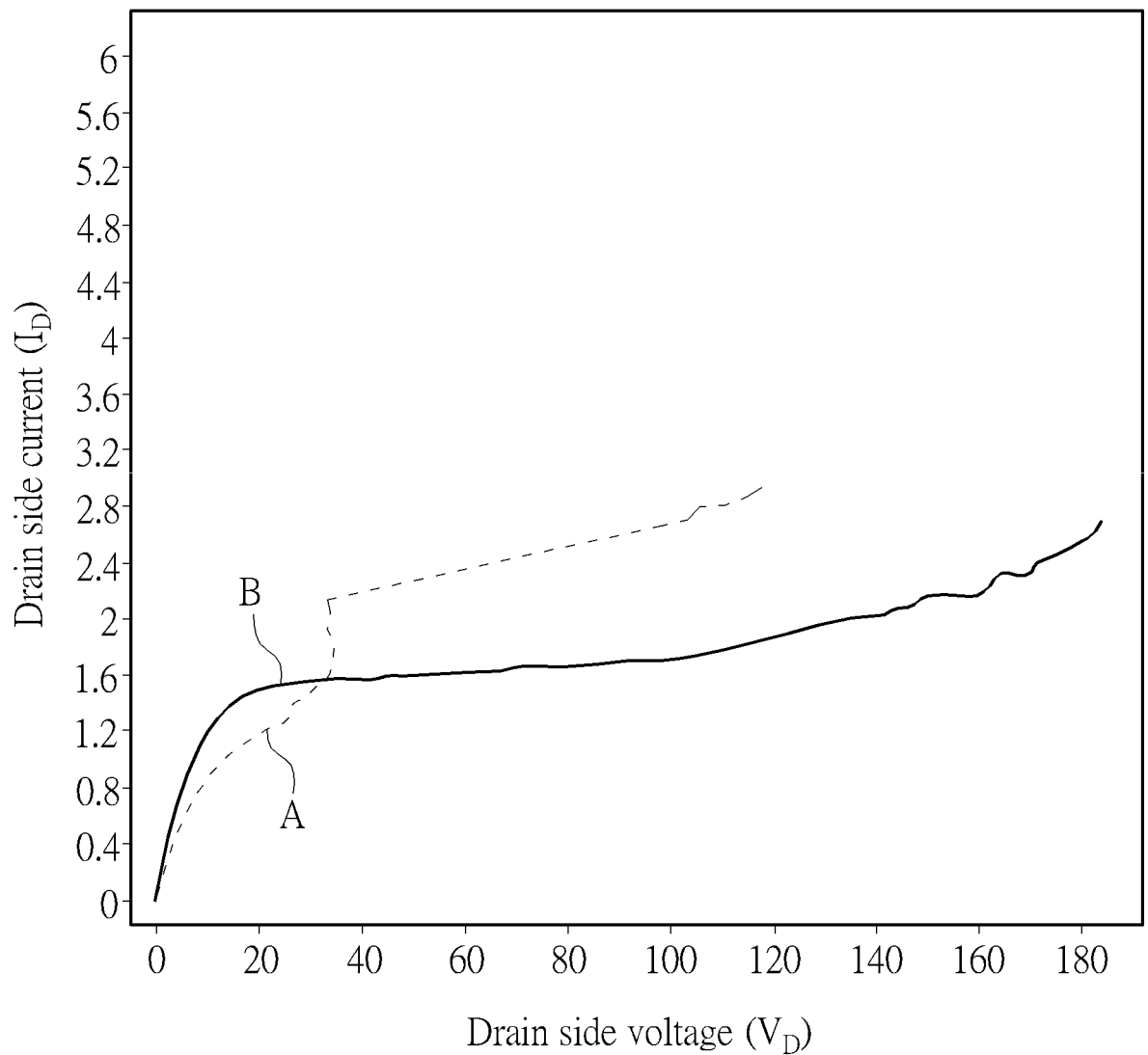
FIG. 4 is a schematic diagram illustrating a transmission-line pulse test (TLP test) of a high-voltage semiconductor device of the present disclosure.

With such arrangements, the isolating doped region 330 of the present embodiment not only improves the impedance of the high-voltage semiconductor device 300, the discontinuous structure between the first doped portion 331, the second doped portion 333, and the third doped portion 335 of the isolating doped region 330 also generates a segmental impedance. In this way, when a high-voltage signal passes through the first doped portion 331, the second doped portion 333, and the third doped portion 335 in sequence, the current may undergo segmental and discontinuous conditions that lead to current reforming, thereby making the electric field more uniform. Please refer to FIG. 4, which illustrates a transmission-line pulse test of the high-voltage semiconductor device 100 in the first embodiment and the high-voltage semiconductor device 300 in the second embodiment. As shown in FIG. 4, the curve A indicates the linear relationship between the drain side current ($I_D$) and the drain side voltage ($V_D$) of the high-voltage semiconductor device 100, and the curve B indicates the linear relationship between the drain side current and the drain side voltage of the high-voltage semiconductor device 300. It is noted that, the high-voltage semiconductor device 300 of the present disclosure improves the Kink effects of the high-voltage semiconductor device, so as to avoid issues of discontinuous current or abnormal increased current under the high-voltage operation. Accordingly, the high-voltage semiconductor device 300 of the present disclosure may obtain better device reliability.

Additionally, the high-voltage semiconductor device 300 further includes a drain doped region 370 disposed in the first high-voltage well region 130, and the drain doped region 370 includes the second conductive type (N-type). The drain doped region 370 is for example disposed below the drain region 170, within the first high-voltage well region 130, and a doped concentration of the drain doped region 370 is preferably less than the doped concentration of the drain region 170. For example, the doped concentration of the drain doped region 370 may be about $1E17-1E18/cm^3$, and a doped depth "d1" of the drain doped region 370 may be about 0.5-1.5 micrometers in the substrate 110, but not limited thereto. With this arrangement, the drain doped region 370 may further increase the impedance of the high-voltage semiconductor device 300, thereby improving the voltage drop ability thereof.

As described herein, the high-voltage semiconductor device of the present disclosure may increase impedance by disposing the segmental isolating doped region and/or the drain doped region. Meanwhile, the uniformity of the electric field is improved, so as to obtain better device reliability and avoid the Kink effect of the high-voltage semiconductor device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage semiconductor device, comprising:
    a substrate, comprising a first conductive type;
    a first insulating structure, disposed on the substrate;
    a drain region, disposed in the substrate and comprising a second conductive type, the second conductive type being complementary to the first conductive type;
    a source region, disposed in the substrate and comprising a first portion and a second portion, the first portion comprising the second conductive type, the second portion comprising the first conductive type;
    a deep well region disposed in the substrate, wherein the deep well region comprises the first conductive type, and the source region is disposed in the deep well region;
    a gate, disposed on the substrate, between the source region and the drain region, the gate covering one side of the first insulating structure; and
    an isolating doped region, disposed in the substrate, the isolating doped region comprising a first doped portion and a second doped portion, wherein the first doped portion and the second doped portion comprise the first conductive type, and the first doped portion and the second doped portion are separately disposed under the first insulating structure.

2. The high-voltage semiconductor device accordingly to claim 1, further comprising:
    a drain doped region, disposed in the substrate, a doped concentration of the drain region is greater than a doped concentration of the drain doped region.

3. The high-voltage semiconductor device accordingly to claim 1, wherein the first portion and the second portion are separated from each other, and the first portion surrounds the second portion.

4. The high-voltage semiconductor device accordingly to claim 1, wherein the gate partially covers the deep well region.

5. The high-voltage semiconductor device accordingly to claim 1, further comprising a first high-voltage well region disposed in the substrate, wherein the first high-voltage well region comprises the second conductive type.

6. The high-voltage semiconductor device accordingly to claim 5, wherein the drain region, the deep well region and the isolating doped region are all disposed in the first high-voltage well region.

7. The high-voltage semiconductor device accordingly to claim 5, further comprising a second high-voltage well region disposed in the substrate, wherein the second high-voltage well region comprises the first conductive type, and the second high-voltage well region surrounds the first high-voltage well region.

8. The high-voltage semiconductor device accordingly to claim 7, further comprising a body region, disposed in the second high-voltage well region.

9. The high-voltage semiconductor device accordingly to claim 8, further comprising a second insulating structure disposed on the substrate, between the body region and the drain region.

10. The high-voltage semiconductor device accordingly to claim 5, further comprising a buried layer disposed in the substrate, wherein the buried layer comprises the second conductive type, and the buried layer is disposed under the first high-voltage well region.

11. The high-voltage semiconductor device accordingly to claim 1,
   wherein the first doped portion and the second doped portion comprise a same doped concentration and a same doped depth.

12. The high-voltage semiconductor device accordingly to claim 1,
   wherein the first doped portion surrounds the second doped portion.

13. The high-voltage semiconductor device accordingly to claim 1,
   wherein the first insulating structure surrounds the source region.

14. The high-voltage semiconductor device accordingly to claim 1,
   wherein the side of the first insulating structure is adjacent to the source region.

* * * * *